United States Patent [19]
Shelton et al.

[11] Patent Number: 5,341,095
[45] Date of Patent: Aug. 23, 1994

[54] DYNAMOELECTRIC MACHINE STATOR TEST DEVICE

[75] Inventors: James W. Shelton, Raytown, Mo.; Alan A. Marfin, Pittsburgh; George F. Dailey, Plum Borough, both of Pa.

[73] Assignee: Westinghouse Electric Corporation, Pittsburgh, Pa.

[21] Appl. No.: 10,091

[22] Filed: Jan. 27, 1993

[51] Int. Cl.⁵ ............................................. G01R 31/34
[52] U.S. Cl. ...................... 324/772; 324/545
[58] Field of Search ............ 324/158 MG, 545, 546; 340/648; 322/99; 104/283, 284

[56] References Cited

U.S. PATENT DOCUMENTS

| | | | |
|---|---|---|---|
| 3,441,331 | 4/1969 | Kesling | 104/283 |
| 4,803,563 | 2/1989 | Dailey et al. | 348/83 |

OTHER PUBLICATIONS

Sutton, J.; "El-Cid-An Easy Way to Test Stator Cores"; CEGB Research; Jun. 1982; pp. 15-21.

Primary Examiner—Ernest F. Karlsen
Attorney, Agent, or Firm—Peyton C. Watkins

[57] ABSTRACT

A stator testing device for a dynamoelectric machine formed from a plurality of laminations defining a plurality of substantially parallel stator teeth each extending over a preselected length of the stator. The stator testing device includes a housing having a bottom face adapted to be disposed adjacent the stator teeth and a face cover extending outwardly from said bottom face. A chattock coil for detecting stator axial currents is disposed within said housing. The chattock coil has a pair of end portions with bottom surfaces each extending to the bottom face of said housing. A pair of brackets are removably attached to the face cover of said housing, and a magnet is removably attached to each bracket. The magnets are located on the brackets so that the bottom surfaces of the pair of magnets are positioned adjacent to selected corners of adjacent stator teeth and remain in positional relationship to the selected corners as the housing is moved over a preselected length of said stator.

14 Claims, 7 Drawing Sheets

DYNAMOELECTRIC MACHINE STATOR TEST DEVICE

BACKGROUND OF THE INVENTION

1. Field of the Invention

The present invention relates generally to a test device and, more particularly, to a device for testing the stators of dynamoelectric machines.

2. Description of the Prior Art

As is well known in the art, the stator core of a typical dynamoelectric machine has a generally cylindrical configuration and an annular transverse cross section. The stator core includes a longitudinally extending bore through it's center and is formed from a plurality of electrical grade steel laminations. Upon assembly, these laminations form a plurality of stator teeth extending circumferentially around the stator. The plurality of teeth are arranged to define a plurality of channels, generally referred to in the art as stator slots, which extend longitudinally over the length of the stator between adjacent teeth and are arranged to receive electrical conductors. Each lamination is coated with a thin layer of electrically insulating material which prevents the 60 hertz alternating magnetic flux generated in the stator core during machine operation from inducing eddy currents between adjacent laminations. In most dynamoelectric machines, the laminations are electrically connected together at their respective radial end portions where they are supported by the stator frame.

The dynamoelectric machine further includes a cylindrical rotor which is disposed within the stator bore and extends substantially the longitudinal length of the stator. A plurality of electrical windings are disposed on the rotor for inducing a voltage on the stator windings as the rotor rotates.

As is well known in the art, if the electrically insulating material of a particular lamination is defective at a location near the stator bore, a current conducting path is formed through the lamination to the stator frame. Current is induced to flow through the conducting path by the alternating flux generated as the rotor turns. This current flow causes localized lamination heating typically referred to as a "hot spot".

Hot spots can also occur in dynamoelectric machines even though the plurality of laminations are effectively electrically insulated from the stator frame. In this case, the current conducting path is typically completed through a particular lamination and through damaged electrical insulating material between adjacent laminations. For example, the electrical insulating material between adjacent laminations (interlaminar insulation) may be damaged during assembly or maintenance of a stator, particularly during the removal and replacement of the rotor. Hot spots may also be caused by foreign objects or by general deterioration of the interlaminar insulation. If hot spots are undetected, they can increase in magnitude until they cause one or more laminations to melt and may even damage the electrical insulating material surrounding the electrical conductors positioned in the stator slots.

Presently, test devices are available for detecting hot spots in stator cores. For example, stator cores may be tested for hot spot-induced damage using a "thermovision" test. In this test the stator core is excited by a winding to its full rated flux. Any hot spots on the stator teeth are readily detected with an infra-red camera which scans the stator bore. However, this test is unlikely to detect deep-seated hot spots unless more sophisticated temperature measurements are made.

U.S. Pat. No. 4,803,563, which is assigned to the assignee of the present invention, discloses a carriage for carrying a stator test device. When the rotor is disposed within the stator, the annular space, referred to in the art as an air gap, between the rotor and stator is minimal. This patent discloses a carriage that is slidably movable within this annular space between the rotor and stator and has a construction for receiving a testing device for stator inspection. The disclosed carriage allows testing of the stator without costly and time consuming removal of the rotor.

Another type of apparatus suitable for testing stator cores to detect hot spots is a commercially available apparatus referred to as an Electromagnetic Core Imperfection Detector, commonly referred to in the art as an ELCID. The ELCID includes a rectangular box-shaped housing or guide for receiving a chatrock coil. The housing has an open bottom face, and a rectangular, plate-shaped base is attached over a portion of the bottom face for mounting the ELCID to the stator. The longitudinal length of the base is disposed perpendicular to the longitudinal length of the bottom face forming a substantially T-shaped configuration. The base of the ELCID includes two movable, generally rectangular block type structures disposed parallel to each other and arranged to fit within a stator slot. These block structures are adjustable to fit within slots of various widths. To use the ELCID, these two block-type structures are matingly disposed between adjacent stator teeth in a single stator slot. The ELCID is moved manually along the length of the stator and the block structures function as a guides to maintain the ELCID along a straight path defined by the stator slot. The block structures of the ELCID are then placed in adjacent stator slots, and testing is repeated. Using this method, the region tested by the ELCID is positioned between the opposing outer edges of adjacent stator teeth. Testing in this manner ensures that the entire stator is tested because the tested region is well defined, and the possibility of inadvertently failing to test a stator section is avoided.

The previously mentioned chattock coil has two terminations disposed on the lower portion of the housing beside the base. These terminations each have a protruding lip portion functioning as a secondary guide for the block structures. When the ELCID is operational, each lip portion is disposed on a stator tooth corner and forms a seat for the stator tooth corner.

The ELCID requires that the stator core be excited to only about 3 to 5 percent of its full rated flux, which is sufficient to induce eddy currents to flow in a damaged insulation region of the stator. Because the current is very small, however, the damage-induced heating is insignificant. As a result, the ELCID test relies on electromagnetic detection of the axial fault currents flowing through the damaged region.

The chattock coil is used to measure the magnetic scaler potential between adjacent teeth to detect the presence of fault currents. The output of the coil is detected and amplified to yield a D.C. voltage proportional to the component of fault current. The chattock coil signal is compared in a signal processor to a constant signal derived from a reference coil which is maintained at one position in the stator. The purpose of the reference signal is to provide phase information required to make the processor more sensitive to axially flowing currents and thereby increase discrimination with respect to the fault currents.

Under certain conditions the ELCID may either be very difficult to operate or completely inoperable. For example, the stator slot depth may be minimal due either to deterioration or by design. This condition renders the block structures of the ELCID inoperable to fit within the stator slots. Further, the stator teeth corners may be rounded due to deterioration or by design, preventing the lip portions of the ELCID from seating on the stator teeth corners. Under these circumstances, neither the block-type structures nor the lip portions forming secondary guides are operable to maintain the ELCID in a straight path as it is moved along the stator. If the guides of the ELCID are not operable, the ELCID moves in an non-linear path when it is pushed along the stator by test personnel. This results in undesirable test results since portions of the stator are not tested. Portions of the stator may go untested since a non-linear testing path causes the boundary of a given testing region to waiver, making it difficult to determine exactly what region was previously tested. If the boundaries of adjacent testing paths are not contiguous, portions of the stator may go untested. To compensate for certain portions possibly being untested, retesting may be done to ensure that all regions of the stator are tested. Obviously, this increases the time and costs of testing the dynamoelectric machine.

Therefore, what is needed is an improved test device for testing a stator core which is operable to travel in a straight path defined by the stator slots as the test device is manually moved longitudinally along the stator.

SUMMARY OF THE INVENTION

The present invention provides an improvement designed to satisfy the aforementioned needs. Particularly, the present invention is directed to a hand held testing device for a dynamoelectric machine stator formed from a plurality of laminations defining a plurality of substantially parallel teeth each having a pair of corner portions, an outer surface between the corner portions and extending over a preselected length of the stator. The testing device comprises: (a) a housing having a bottom face adapted to be disposed adjacent the stator teeth and a face cover extending outwardly from said bottom face; (b) coil means for detecting stator axial currents and disposed within said housing, said coil means having a pair of end portions with bottom surfaces each extending to said bottom face of said housing; (c) bracket means removably attached to said face cover of said housing; and (d) a pair of magnets each having a bottom surface, each of said pair of magnets being removably attached to said bracket means and located on said bracket means so that said bottom surfaces of said pair of magnets are positioned adjacent to selected corners of adjacent teeth and remain in adjacent positional relationship to said selected corners as said housing is moved over a preselected length of said stator.

BRIEF DESCRIPTION OF THE DRAWINGS

While this specification concludes with claims particularly pointing out and distinctly claiming the subject matter of the invention, it is believed the invention will be better understood from the following description, taken in conjunction with the accompanying drawings wherein:

DETAILED DESCRIPTION OF THE INVENTION

In the following description, like reference characters designate like or corresponding parts throughout the several views of the drawings. Also in the following description, it should be understood that such terms as "forward", "rearward", "left", "right", "upwardly", "downwardly", and the like, are words of convenience and are not to be construed as limiting.

Figure 1:
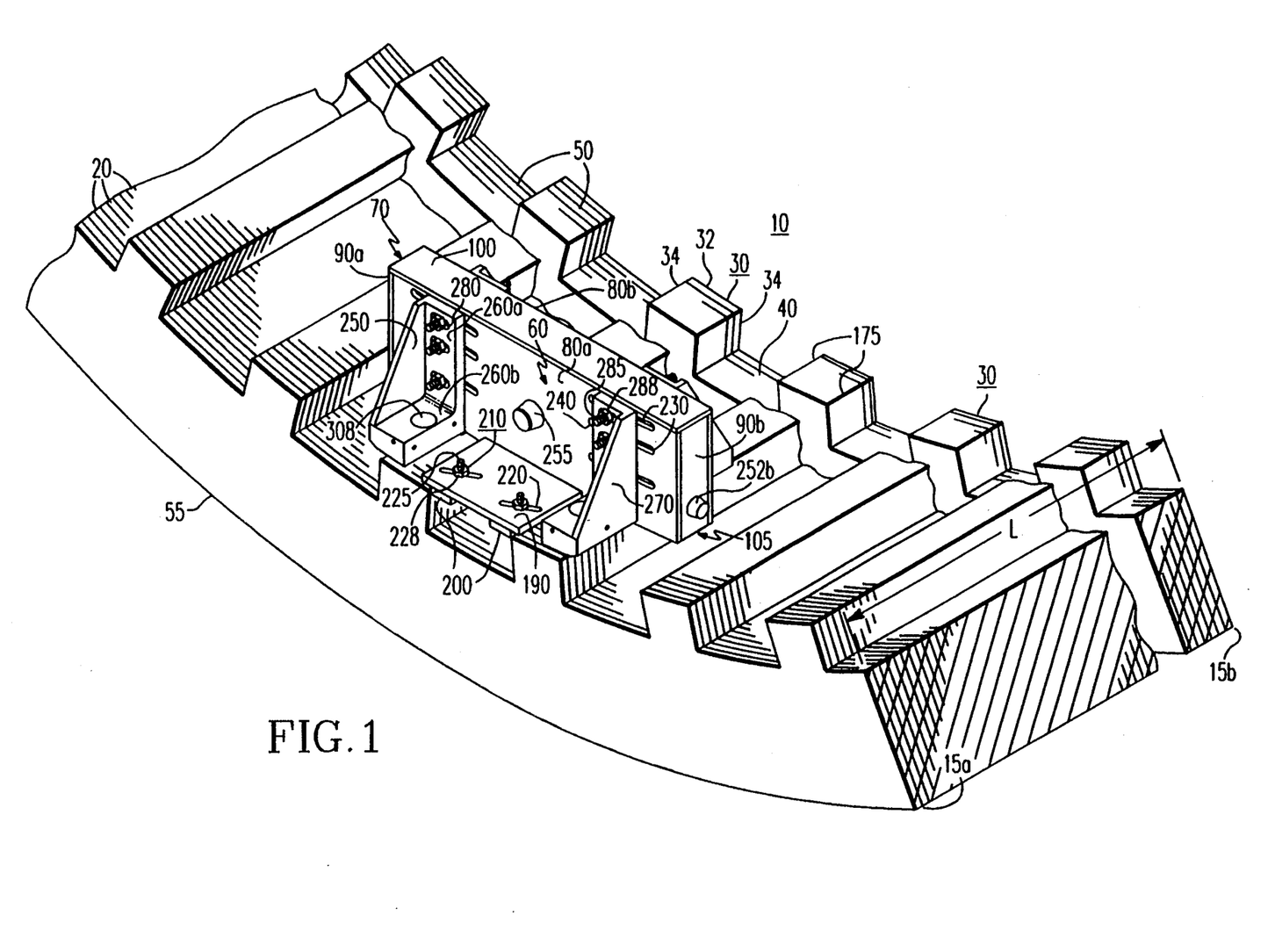
FIG. 1 is a fore-shortened perspective view of a portion of a stator core and an improved testing device which is the subject of the present invention and operable for detecting hot spots in the stator core.

Now referring to the drawings, and particularly to FIG. 1, there is illustrated a portion of a stator of a large dynamoelectric machine, generally designated by the numeral 10. As is well known in the art, the stator 10 has a generally cylindrical configuration and a generally annular transverse cross section defining a longitudinal bore through the stator 10. The stator 10 has two ends 15a and 15b and a longitudinal length (L). The stator 10 is formed from a plurality of laminations 20, and and each of the laminations 20 is configured so that upon assembly the plurality of laminations 20 define a plurality of protruding stator teeth 30. The stator teeth 30 have an outer surface 32 extending between stator teeth corners 34. A plurality of individual channels, herein referred to as stator slots 40, are disposed between adjacent teeth 30. A plurality of stator windings (not shown) are disposed in the stator slots 40. The stator 10 includes a generally cylindrical inner peripheral surface 50 having recessed portions (stator slots 40) and a generally cylindrical outer peripheral surface 55. Upon generator assembly, an elongated generally cylindrical rotor (not shown) having two ends is disposed within the stator 10 bore for inducing a voltage on the stator. A plurality of electrical windings (not shown) are disposed on the rotor for inducing a voltage on the stator windings.

A testing device 60 is adapted for movement along the inner peripheral surface 50 and functions to detect any axial current in the stator 10. The testing device 60 includes a box shaped housing 70 formed from two rectangular first faces 80a and 80b disposed generally parallel to each other. Two generally rectangular side faces 90a and 90b, also generally parallel to each other, are removably attached and perpendicular to both first faces 80a and 80b. A generally rectangular top 100 is removably attached and perpendicular to both the first faces 80a and 80b and the side faces 90a and 90b. Upon Assembly, the first faces 80a and 80b, side faces 90a and 90b, and the top 100 form a rectangular box configuration having one surface adjacent to the inner surface 50 which is open and herein referred to as a bottom face 105. The bottom face 105 is defined by the edges of the sides 90a and 90b and first faces 80a and 80b. A generally rectangular base 190 extends through the bottom face 105 and through a portion of both first faces 80a and 80b and extends outwardly from the housing 70. Two generally rectangular blocks 200 are movably attached to the base 190. The blocks 200 are positioned in a single stator slot 40 to maintain the testing device 60 in a generally straight path defined by the stator slot 40 as the testing device is moved manually be test personnel. The blocks 200 are removably attached to the base 190 by securing means 210, such as bolts passing through gase slots 220. Although FIG. 1 illustrates only two base slots 220, there are a total of four base slots 220, with two base slots being disposed adjacent each of the first faces 80a and 80b. The four base slots 220 for receiving the bolts 210 are elliptically shaped and are generally slanted with respect to the housing 70. The bolts 210 are slidably movable within the slots 220, and one bolt 210 is attached to each end of each block 200. The blocks 200 may be adjusted to matingly fit within stator slots 50 of varying widths by slidably moving the bolts 210 within the slots 220. Each bolt 210 has an elongated threaded shaft 225 extending upwardly from the base 190 and through the slot 220. A nut 228 is threaded onto each bolt shaft 225 and is tightened to fix the blocks 200 in a predetermined positional relationship relative to the base 190. The nuts 228 are loosened to allow the blocks 200 to be adjusted and retightened once the blocks 200 are at the predetermined position.

The housing 70 includes a pair of three, generally elliptically shaped slots 230 formed in first face 80a and 80b. Non-metallic attachment means 240 are disposed in each of the slots 230 for attaching two L-shaped brackets 250 on the first faces 80a and 80b. Non-metallic attachment means 240 are preferred to prevent electrical interference with the operation of the testing device 60. Each bracket 250 has three elliptically shaped slots 280 which mate with these slots 230 for receiving the attachment means 240. Each attachment means 240 has a bolt configuration with the bolt head (not shown) disposed in the interior of the housing for abutting an interior surface of the first face 80a or 80b. A threaded bolt shaft 285 extends through a pair of mating slots 230 and 280, and a nut 288 is threaded onto the bolt shaft 285 for maintaining the positional relationship of the bracket 250 with respect to the housing 70.

Figure 2:
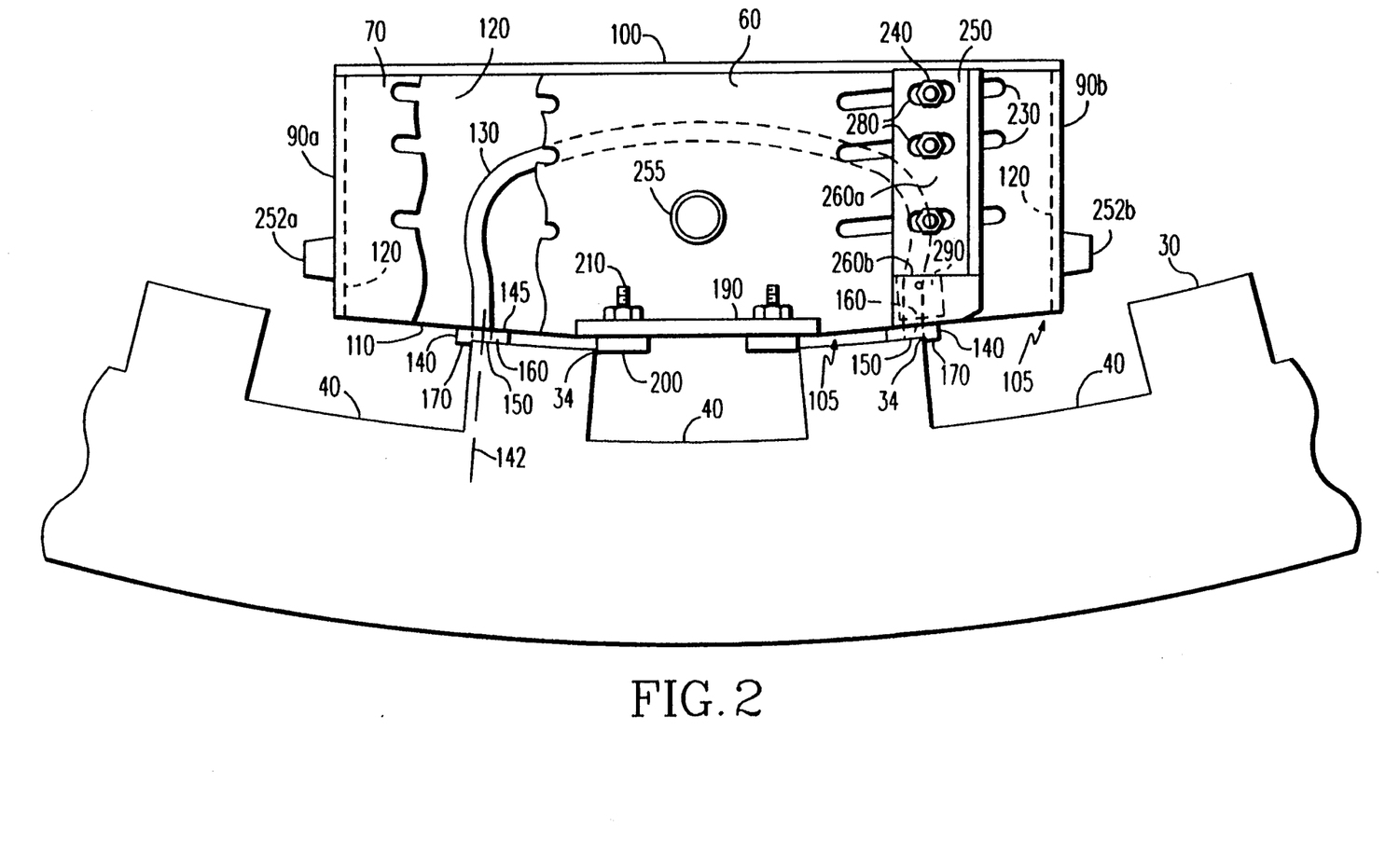
FIG. 2 is a view in side elevation of the testing device of FIG. 1 with one bracket mounted on one portion of the testing device and another portion of the testing device broken away.

Referring to FIG. 2, the housing 70 is illustrated having a substantially hollow interior 120. A generally cylindrical coil 130 having two ends is disposed within the housing 70 for detecting stator axial currents. The coil 130 is disposed generally semi-circular within the housing 70, and the coil ends terminate at the housing bottom face 105. The coil 130 is formed from a plurality of helix shaped wires (not shown) enclosed by a protective outer braided sheath. Each coil 130 end includes a termination device 140 having a centerline 142 and a generally rectangular transverse cross section. The termination devices 140 are non-metallic to prevent electrical interference with the operation of the testing device 60, and include a generally rectangular top and bottom faces 145, 150 joined together by four generally rectangular side faces 160. The top face 145 of each termination device 140 abuts the housing bottom face 105. The bottom face 150 has a protruding lip portion 170 forming a seat for a stator tooth corner 34. When the stator teeth corners 34 are sharply defined to form substantially right angles, each lip portion 170 functions as a secondary means for maintaining the testing device 60 along the straight path defined by the stator corners 34 as the testing device 60 is moved during operation.

Figure 3:
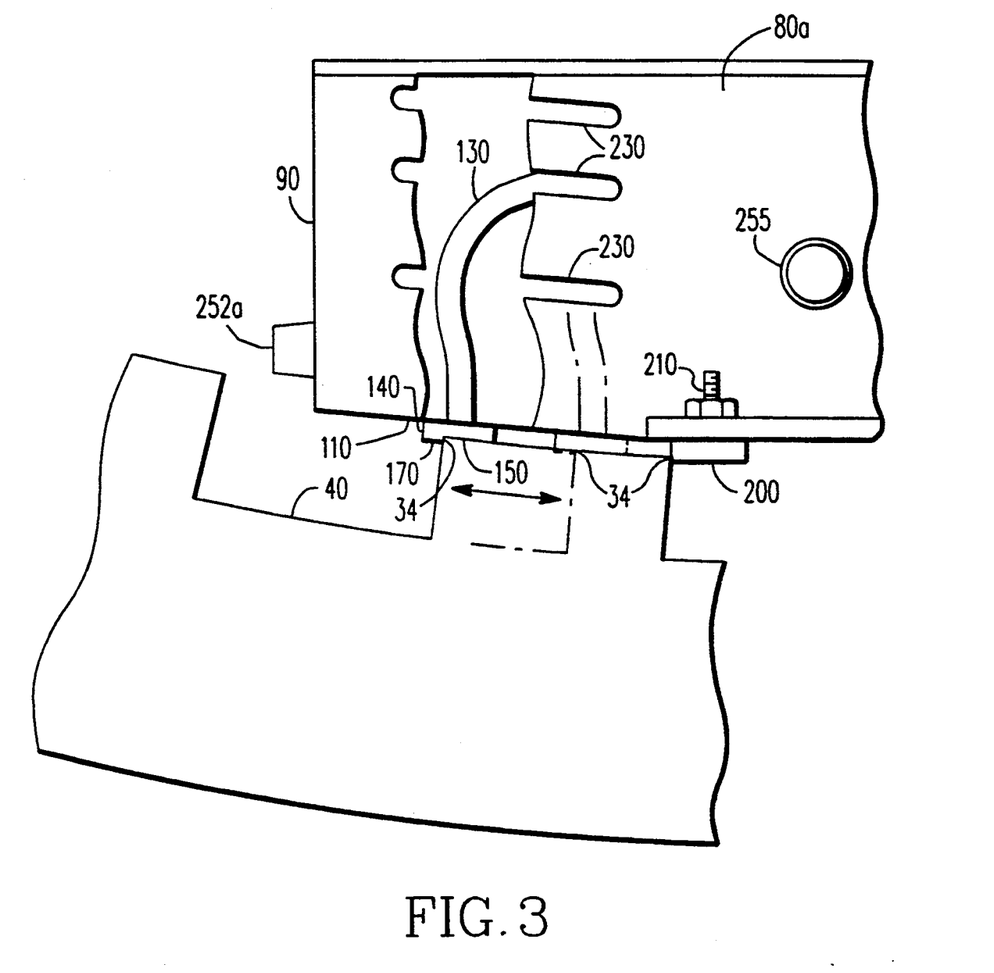
FIG. 3 is a view in side elevation of a portion of the testing device illustrating the adjustment mechanism of a chattock coil positioned within the testing device.

Two generally circular knobs 252a and 252b are respectively located at the side faces 90a and 90b, and each communicates with a single termination device 140. As best seen in FIG. 3, due to different widths of the stator slots 40, the termination devices 140 should be capable of being moved to accommodate such different widths. As shown in phantom, the termination device 140 is moved inwardly and outwardly by turning the knob 252a. This allows the lip portion 170 to move as required to seat firmly against a stator corner 34. A knob 255 is disposed on first face 80a and communicates with the coil 130. As is well known in the art, the knob communicates with the coil 130 to adjust the coil 130 resistance.

Figure 4:
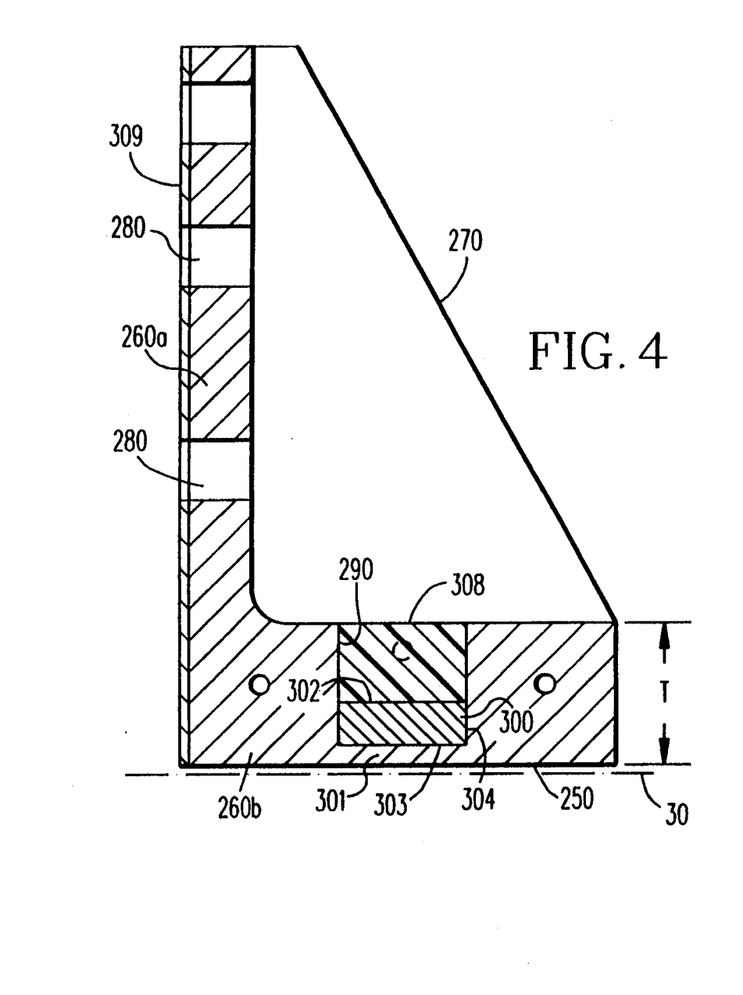
FIG. 4 is a side elevational view of the bracket used to hold the testing device on the stator.
Figure 5:
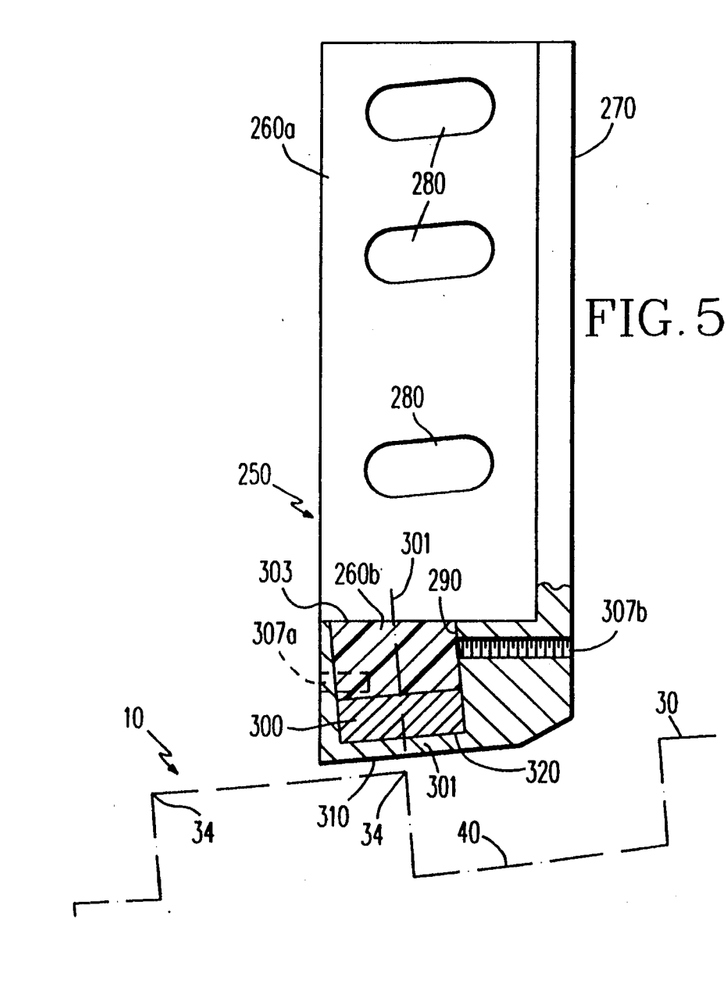
FIG. 5 is a front elevational view of the bracket used to hold the testing device on the stator.
Figure 6:
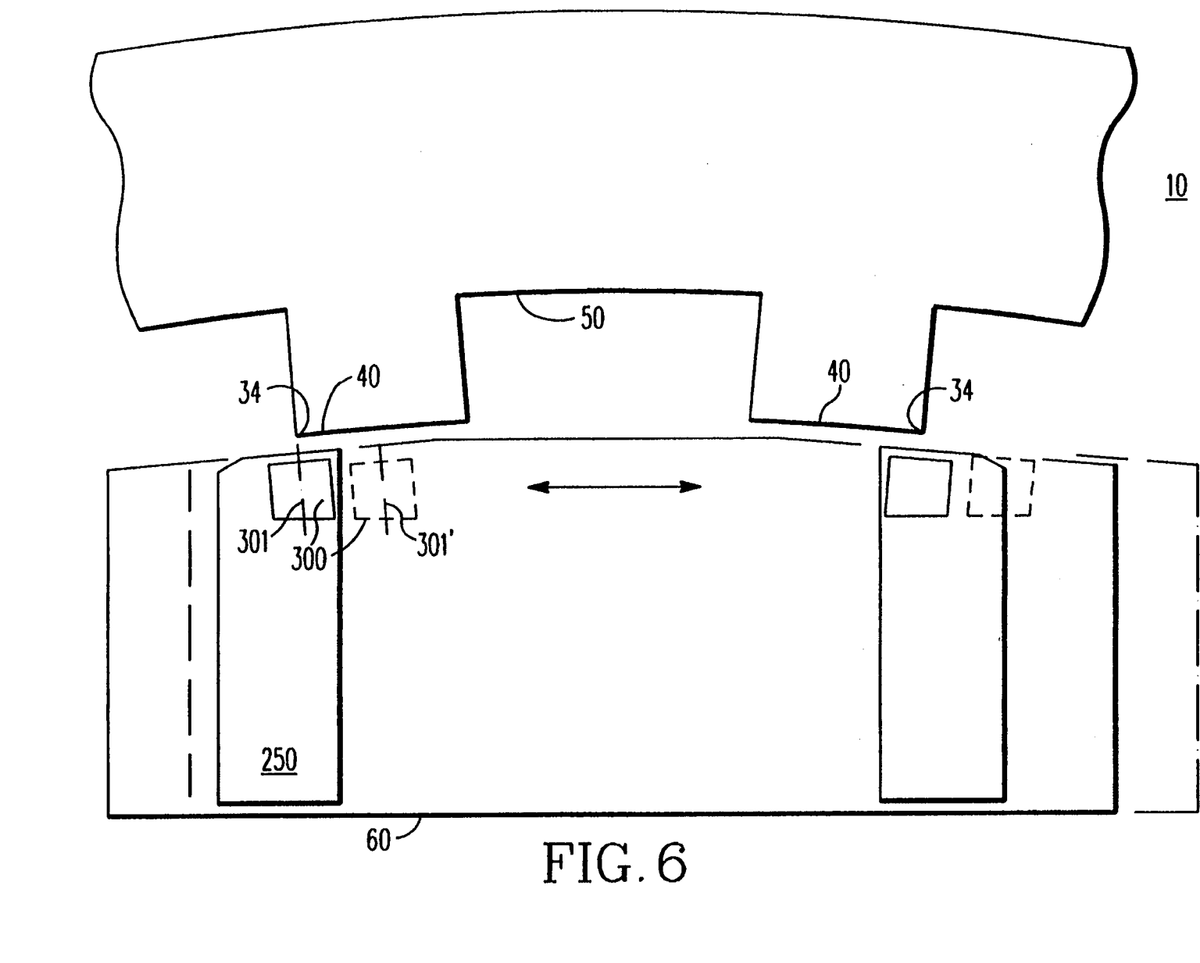
FIG. 6 is a schematic of the testing device disposed on the stator illustrating the self-centering and temporary holding mechanism of the brackets of the present invention.

Referring to FIGS. 4 and 5, each bracket 250 includes two generally bar-like portions 260a and 260b that are integrally attached and perpendicular to each other. A substantially triangular sheet-like stiffener portion 270 is integrally attached to both bar portions 260a and 260b for additional strengthening of the bracket 250. Bar-like portion 260b has a thickness (T) and includes a bore 290. A magnet means 300, such as a magnet, is positioned in the bore 290. The magnet means 300 is typically made of neodymium or boron neodymium. The brackets 250 are preferably made from a non-metallic and non-conducting material, such as plastic. The bar-like portion 260a includes a plastic bottom portion 301 to prevent the magnet 300 from contacting the stator. As best seen in FIG. 6, the magnets 300 are disposed so that their centerlines 301 are located over the opposing corners of adjacent stator teeth. With this arrangement, the magnets 300 maintain the testing device 60 along the straight line defined by the stator slots 40. Again, referring to FIGS. 4 and 5, each magnet 300 has a top surface 302 and a bottom surface 303 with a side surface 304 extending therebetween. The magnets 300 are positioned so that they are at least one and one half (1.5) inches away from the centerline 142 of the a termination device 140 (see FIG. 2). A cap 308 is disposed abuttingly atop the magnet 300 for firmly securing the magnet 300 within the bore 290. The cap 308 is secured by two threaded devices 307a and 307b each threaded into bar portion 260b. The bar portion 260a includes an adhesive-like surface 309 providing a rough frictional surface for further securing of the brackets 250 against the first faces 80a and 80b (FIG. 1).

It should be understood that the bar-like portion 260b which is positioned adjacent the stator teeth 30 should conform to the generally cylindrical shape of the stator 10 to avoid scrapping or damaging the stator teeth 30. Thus, the brackets 250 have a slanted surface 310 that functions to keep the bar-like portion 260b substantially parallel to the surfaces 32 of the stator teeth 30. For maximum attractive force of the magnet 300, the magnet bottom surface 303 should also be parallel to the surfaces 32 of the stator teeth 30. For maintaining this parallel relationship, the bore 290 has a slanted wall 320 for maintaining the magnet 300 in this slanted position.

Figure 4A:
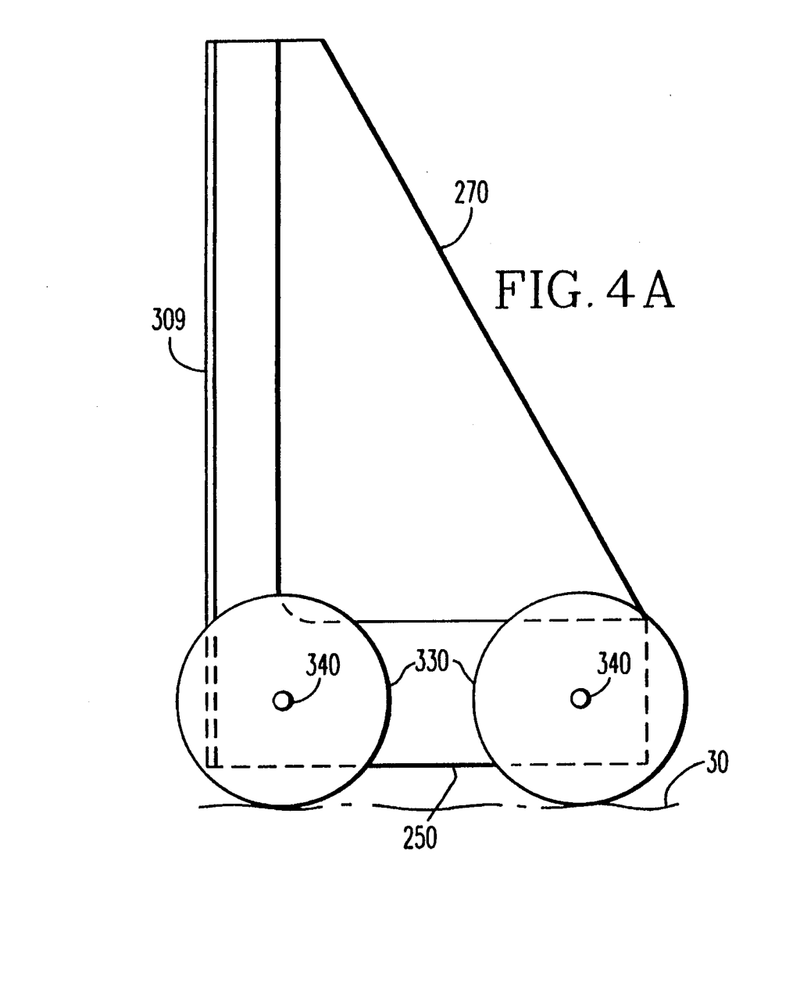
FIG. 4A is a side elevational view of an alternative embodiment of the bracket of the present invention.
Figure 5A:
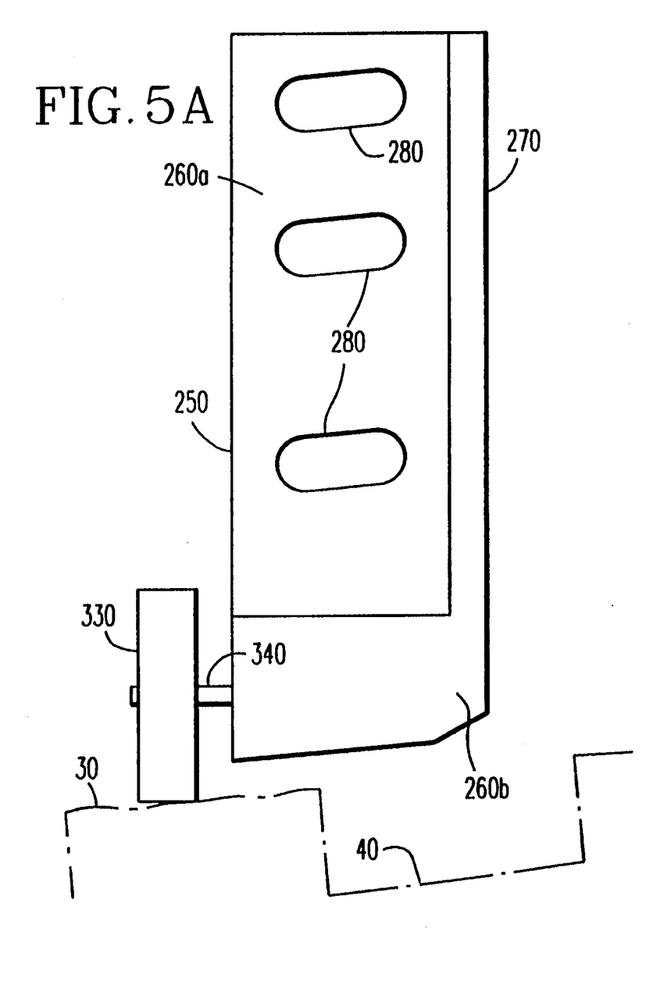
FIG. 5A is a front elevational view of an alternative embodiment of the bracket of the present invention.

In an alternative embodiment of the present invention illustrated in FIGS. 4A and 5A, a pair of wheels 330 may be added to the bar-like portions 260a of the brackets 250 providing a smooth motion over the stator teeth 30 when the testing device 60 (see FIG. 1) is moved over the stator teeth 30 which, in some instances, may have an uneven contour. The wheels 330 are attached to the bracket 250 by an axle 340 having two ends. One end extends through the center of the wheel 330 and the other end is attached to the bar portion 260b. The wheels 330, in this embodiment, are positioned adjacent the bar-like portion 260b on the side opposite the triangular portion 270. The wheels 330 should be positioned so that the bracket 250 extends over the stator teeth 30.

To better appreciate the function of the brackets 250, reference is made to FIG. 6. As seen in FIG. 6, if the testing device 60 is positioned over the stator 10 as illustrated in phantom and the magnets 300 centerlines 301 become misaligned with the opposing stator teeth corners 34, the magnets 300 are forced by magnetic attraction back into alignment with the opposing stator teeth corners 34. The magnets 300 can also hold the testing device 60 against the stator 10 to allow personnel using the testing device 60 to temporarily leave the testing device 60 in place without removing the testing device 60 from the stator 10.

Figure 7:
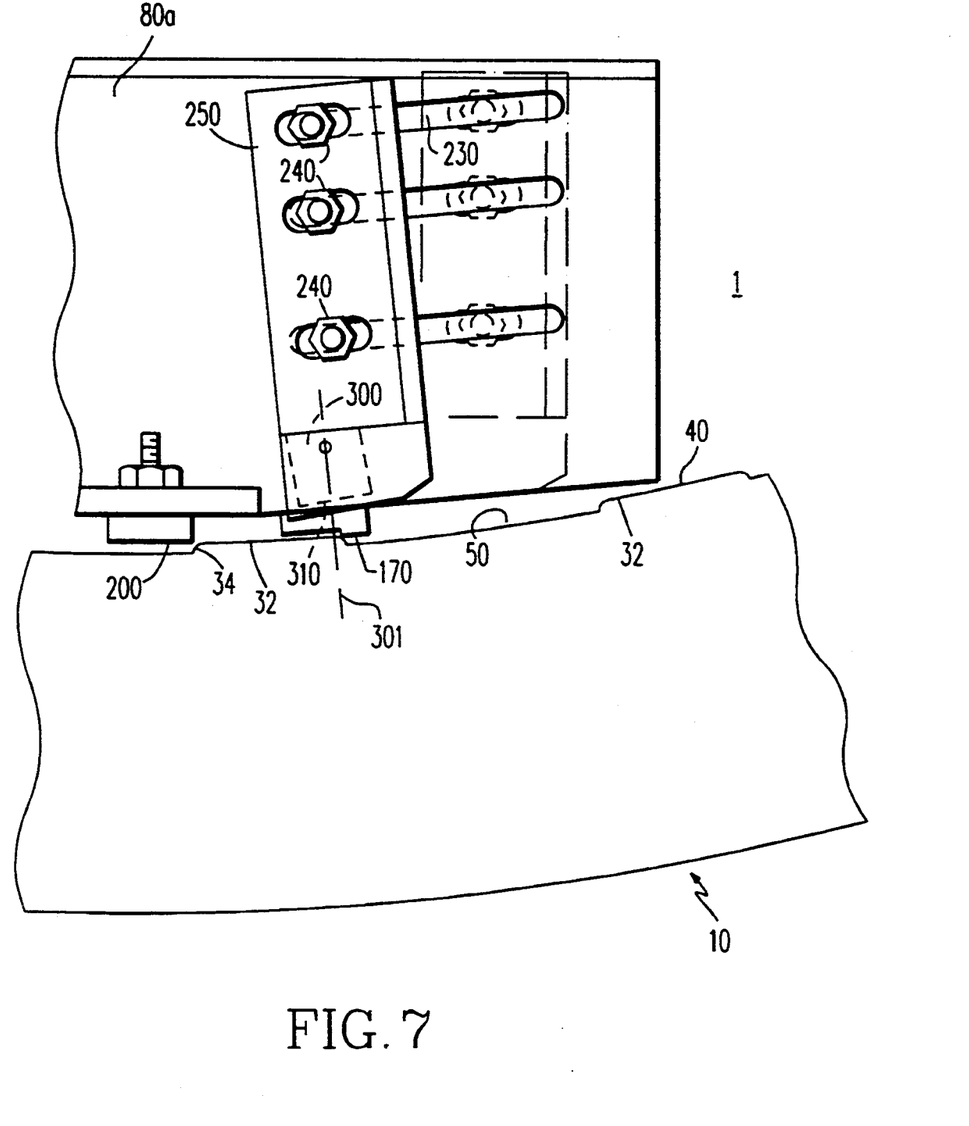
FIG. 7 is a front fragmentation view in elevation of the testing device with the brackets of the present invention for depicting adjustment of the bracket.

Referring to FIG. 7, the adjustment of the brackets 250 is illustrated for compensating for different stator slot 40 widths and for maintaining the magnet surface 310 parallel to the surfaces 32 of the stator teeth 30. The attachment means 240 may be moved within the slots 230 thereby allowing the brackets 250 to either be tilted slightly or moved inwardly and outwardly.

To use the testing device 60 reference is made to FIG. 7. As seen in FIG. 7, the testing device 60 is disposed on the stator 10 so that the magnet's centerline 301 aligns with a stator tooth corner 34. In testing the stator 10 for axial currents, the testing device 60 is manually pushed along the stator 10 with the magnets 300 maintaining the testing device 60 aligned with the opposing corners 34 of adjacent teeth 30.

Although the invention is fully described herein, it is not intended that the invention as illustrated and described be limited to the details shown, because various modifications may be obtained with respect to the invention without departing from the spirit of the invention or the scope of equivalents thereof.

We claim:

1. A hand-held testing device for a dynamoelectric machine stator formed from a plurality of laminations configured to define a plurality of substantially parallel teeth each having a pair of corner portions, an outer surface between the corner portions and extending over a preselected length of the stator, the testing device comprising:
   (a) a housing having a bottom face adapted to be disposed adjacent the stator teeth and a face cover extending outwardly from said bottom face;
   (b) coil means for detecting stator axial currents and disposed within said housing, said coil means having a pair of end portions with bottom surfaces each extending to said bottom face of said housing;
   (c) bracket means removably attached to said face cover of said housing; and
   (d) a pair of magnets each having a bottom surface, each of said pair of magnets being removably attached to said bracket means and located on said bracket means so that said bottom surfaces of said pair of magnets are positioned adjacent to selected corners of adjacent teeth and remain in adjacent positional relationship by magnetic attraction to said selected corners as said housing is moved over a preselected length of said stator.

2. The apparatus as in claim 1 wherein said bracket means includes a pair of brackets movably attached to said face cover so that said pair of brackets may be spaced a preselected distance apart and so that each of said brackets may be positioned at a preselected angle relative to said bottom face.

3. The apparatus as in claim 2 wherein said bracket means is attached to said housing by non-metallic attachment means.

4. The apparatus as in claim 3 wherein the magnet means are positioned at least one and one half inches from a centerline extending through the end portions of said coil means.

5. The apparatus as in claim 4 wherein said bracket means has a L-shaped configuration.

6. The apparatus as in claim 5 wherein said bracket means has an arcuate shaped surface adapted to be disposed adjacent the stator to conform generally to the shape of the stator.

7. The apparatus as in claim 6 wherein the face cover of said housing includes a plurality of slots for receiving the attachment means and permitting the attachment means and the pair of brackets to be positioned at a preselected location on said face cover.

8. The apparatus as in claim 7 wherein said bracket means has a side support attached to said L-shaped bracket for strengthening said bracket means.

9. The apparatus as in claim 8 wherein said magnet means are high strength neodymium magnets.

10. The apparatus as in claim 1 wherein said bracket means includes a wheel attached to said bracket for permitting said housing to slidably move along the stator.

11. A hand held testing device for a dynamoelectric machine stator formed from a plurality of laminations configured to define a plurality of substantially parallel teeth each having a pair of corner portions, an outer surface between said corner portions and extending over a preselected length of the stator, the testing device comprising:
   (a) a housing having two face covers, two side faces and a top arranged to form a box-like housing;
   (b) coil means for detecting axial currents and disposed within said housing, said coil means having two end portions each terminating at a bottom face of said housing disposed between the two face covers;
   (c) at least two L-shaped brackets secured to, each of said face covers; and
   (d) a pair of magnets each having a bottom surface, each of said pair of magnets being removably attached to one of said brackets and located on said bracket so that said bottom surfaces of said pair of magnets are positioned adjacent to selected corners of adjacent teeth and remain in positional relationship by magnetic attraction to said selected corners as said housing is moved over a preselected length of said stator.

12. The apparatus as in claim 11 wherein each of said magnets is a high strength neodymium magnet.

13. The apparatus as in claim 11 wherein, each of said magnets is a neodymium boron magnet.

14. The apparatus as in claim 11 wherein said pair of magnets function to maintain the positional relationship between said housing and the stator when said housing is positioned on the stator.

* * * * *